US007551022B2

(12) United States Patent
Arknæs-Pedersen et al.

(10) Patent No.: US 7,551,022 B2
(45) Date of Patent: Jun. 23, 2009

(54) POWER SUPPLY COMPENSATION

(75) Inventors: Lars Arknæs-Pedersen, Viby J (DK); Kim Rishøj Pedersen, Egå (DK)

(73) Assignee: TC Electronic A/S (DK)

( * ) Notice: Subject to any disclaimer, the term of this patent is extended or adjusted under 35 U.S.C. 154(b) by 0 days.

(21) Appl. No.: 10/575,738

(22) PCT Filed: Oct. 10, 2003

(86) PCT No.: PCT/DK03/00688

§ 371 (c)(1), (2), (4) Date: Sep. 26, 2007

(87) PCT Pub. No.: WO2005/036734

PCT Pub. Date: Apr. 21, 2005

(65) Prior Publication Data

US 2008/0129375 A1 Jun. 5, 2008

(51) Int. Cl.
*H03F 3/38* (2006.01)

(52) U.S. Cl. .......................................... 330/10; 330/251

(58) Field of Classification Search .................. 330/10, 330/207 A, 251, 85

See application file for complete search history.

(56) References Cited

U.S. PATENT DOCUMENTS 5,974,089 A * 10/1999 Tripathi et al. ................ 330/10
6,140,875 A * 10/2000 Van Den Homberg et al. .......................... 330/251
6,297,692 B1 10/2001 Nielsen
6,344,811 B1 2/2002 Melanson
6,518,838 B1 2/2003 Risbo
2002/0180518 A1 12/2002 Midya et al.

FOREIGN PATENT DOCUMENTS

EP 1 376 858 1/2004
JP 2004-201187 * 7/2004

OTHER PUBLICATIONS

International Search Report; PCT/DK03/00688; May 18, 2004.

* cited by examiner

*Primary Examiner*—Khanh V Nguyen
(74) *Attorney, Agent, or Firm*—Cantor Colburn LLP

(57) ABSTRACT

The invention relates to an amplifier comprising amplification means (AM) comprising an input and an output, said amplification means (AM) comprising a switching output stage delivering at least one output signal (OUS) via said output, said amplification means being fed by power supply means (PSM) said amplifier further comprising compensation means (CM) providing a compensation signal (CS) derived from the power supply voltage (PSV) of the power supply means (PSM), said compensation signal (CS) comprising a substantially inverse representation of said power supply voltage (PSV) and said compensation signal (CS) being fed to said amplification means (AM). According to the invention, an effective error compensation of the output switching stage may in practice be implemented by establishment of a compensation, which on a run-time basis is based on the voltage of the power supply currently applied in the output switching stage.

14 Claims, 8 Drawing Sheets

Figure 1:
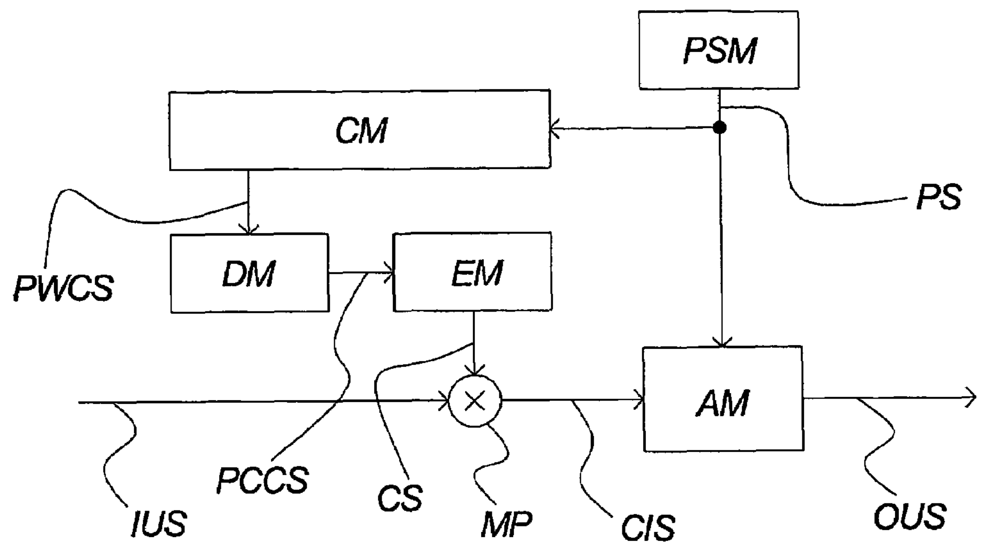

CM
RS
SP
MIS
QM
PWCS
LF
MM
D Q
SG
PSVR
MRS
BM
DAC

POWER SUPPLY COMPENSATION

FIELD OF THE INVENTION

The present invention relates to power supply compensation.

BACKGROUND OF THE INVENTION

The invention addresses different problems related to the use of switching amplifiers. Switching amplifiers have been known for several years and have over the last years gradually been introduced into different technical fields, such as motor control, audio-applications, etc.

An advantage of switching amplifiers is among many that a power output may be obtained more or less directly on the basis of the available power supply, thereby reducing the requirement of high-power transformers, etc.

One problem of such amplifiers is, however, that a relatively unstable power supply may have a significant influence on the resulting amplified signal.

One of the objects of the invention is to reduce problems resulting from errors on the switching stage of an amplifier.

SUMMARY OF THE INVENTION

The present invention relates to an amplifier comprising amplification means AM comprising an input and an output, said amplification means AM comprising a switching output stage delivering at least one output signal OUS via said output, said amplification means being fed by power supply means PSM said amplifier further comprising compensation means CM providing a compensation signal CS derived from the power supply voltage PSV of the power supply means PSM, said compensation signal CS comprising a substantially inverse representation of said power supply voltage PSV and said compensation signal CS being fed to said amplification means AM.

According to the invention, an effective error compensation of the output switching stage may in practice be implemented by establishment of a compensation, which on a run-time basis, is based on the voltage of the power supply currently applied in the output switching stage.

Another way of describing the invention is basically, that an error signal, the compensation signal, is fed to the amplification means by incorporating the compensation signal into the input signal which is to be amplified, in order to counteract expected errors in the amplifier stage.

The inverse representation of the power supply voltage PSV refer in the present application to a compensation signal which when added or multiplied to the input signal of an amplifier results in an amplified signal as if variations in the power supply voltage was at least partially counteracted. In other words, variations in the power supply voltage are at least partially counteracted by modification of the input signal.

Thus the signal to be amplified is compensated by modification of the signal itself, instead of controlling the amplifier and/or power supply, i.e. the signal adapts to the current state of the power supply and amplifier. Thereby applications incorporating the present invention may offer high quality amplification without depending on sophisticated, inflexible and expensive power supplies.

According to embodiments of the present invention, the compensation signal may be fed to the amplification means at different stages, and in different ways. Possibilities e.g. comprise multiplying the compensation signal to the input utility signal prior to any processing, subsequent to an upsampling process, subsequent to a quantizing and/or noise-shaping process, etc. Further possibilities e.g. comprise converting the compensation signal to an analog signal in order to modify an analog input signal, resample and/or modulate the compensation signal in order to adapt it to a particular encoding or modulation scheme, etc. Further possibilities e.g. comprise adapting the amplification means in order to facilitate feeding the compensation signal directly into the amplification means, and further adapting the amplification means with means for applying the compensation signal to the input signal.

In a preferred embodiment of the present invention said substantially inverse representation of the power supply voltage PSV is scaled by a ratio substantially corresponding to a desired amplification between the output and the input of the amplification means AM.

According to a preferred embodiment of the invention, the applied compensation signal should preferably correspond to an input signal, which when fed through the amplifier fully compensates for the undesired error on the output stage. When the compensation signal basically represents a desired voltage DV multiplied by the reciprocal of the power supply voltage PSV, an absolute gain regulation of the PWM signal has been obtained. It is thus possible to utilize the present invention for power regulation purposes as well as power supply compensation, as long as the input signal dynamics provides the additional overhead necessary in order to multiply the input signal with a compensation signal preferably greater than 1.0.

In a preferred embodiment of the present invention said compensation signal is established for maintaining a substantially fixed utility area of a period of the amplified pulse width modulated signal regardless of changes in the power supply voltage PSV.

According to the invention, a preferred compensation may be obtained by ensuring that the areas of PWM pulses of the output of the amplification switching stage that represents equal input values, are maintained equal, regardless of changes in the power supply voltage, by ensuring that an error such as a reduced amplitude on the output signal, i.e. the amplitude domain e.g. caused by an erroneous power supply voltage, is compensated for by an increased duty cycle (i.e. in the time domain). In other words, a reduced power may be compensated for, i.e. increased, by variation of the duty cycles of the applied signal.

In a preferred embodiment of the present invention said compensation means further comprises extrapolation means EM adapted for modifying said compensation signal CS according to a predefined extrapolation algorithm.

Predefined extrapolation means may according to the invention be established in many ways. However, according to a preferred embodiment of the invention such extrapolation, if necessary, should preferably ensure that an effective compensation is obtained at any time. Therefore, the inherent delay in the establishment of a compensation signal may be somewhat counteracted by applying a prediction, an extrapolation, of the expected variations in the power supply. This may be done due to the fact that the typical variations in the power supply very often are periodical or periodically to a certain degree and relatively slow varying.

In a preferred embodiment of the present invention said compensation signal CS is established on the basis of an inverting generator CM fed by a power supply comprising a circuit adapted for establishing an inverse signal of the voltage of said power supply.

According to a preferred embodiment of the invention, an inverting generator is applied for direct and fast establishment of a compensation signal. This may be compared to a running measuring of the level of the output stage and a subsequent running calculation based on time-consuming division.

In a preferred embodiment of the present invention said inverting generator comprises at least one feedback loop having a power supply voltage dependent feedback.

In a preferred embodiment of the present invention said inverting generator comprises at least one forward path LF, MM, QM having an input and an output, at least one reference oscillator SG at least one feedback path derived from said forward path and fed back to said input of said forward path by means of a summing point SP subtracting the feed-back signal from an input received from said reference oscillator SG wherein said feedback path comprises a power supply voltage dependent feedback In a preferred embodiment of the present invention said inverting generator outputs a digital signal on the output PWCS of said forward path derived from at least one analog signal received in said input PSVR.

In a preferred embodiment of the present invention said forward path comprises a limiter MM adapted for providing a pulse width modulated output signal of said forward path.

In a preferred embodiment of the present invention said forward path further comprises a time quantizer QM converting said pulse width modulated signal, preferably two level, into a time discrete signal fed to the output PWCS of said forward path.

In a preferred embodiment of the present invention said compensation signal is fed to said amplification means via at least one multiplication point MP in which the compensation signal is multiplied with a preferably digital input signal IUS.

In a preferred embodiment of the present invention said compensation means further comprises decimation means DM adapted for transforming said compensation signal CS into compatibility with said input signal IUS.

According to a preferred embodiment of the present invention, the output of the compensation means is preferably a PWM signal PWCS having a sample rate of e.g. 200 MHz. In order to be able to multiply this compensation signal with the input utility signal, which preferably is a high-resolution PCM signal with a sample rate of e.g. 48 kHz, it is necessary to transform the compensation signal. This may be performed by means of a decimation means DM, which may be any kind of suitable decimation means, rate converters, down-samplers, etc. Preferably the decimation means performs anti-aliasing.

In a preferred embodiment of the present invention the signal processing performed by said amplification means multiplicatively depend on the power supply voltage.

According to a preferred embodiment of the invention, the amplification means processes, e.g. amplifies, the input signal in a way multiplicatively dependent on the power supply voltage. Thus the power supply is substantially multiplied to the input signal rather than having its changes added to the input signal. Multiplicatively power supply voltage dependent amplification means may e.g. comprise PWM amplifiers, class D amplifiers, filters comprising limiters, etc.

The present invention further relates to a method for compensating errors of a power signal PS comprising a power supply voltage PSV, comprising the steps of performing multiplicatively power supply voltage dependent signal processing on an input utility signal IUS by means of amplification means AM, establishing a compensation signal CS comprising a representation of the ratio between a desired voltage DV and said power supply voltage PSV, and applying said compensation signal CS to said input utility signal IUS by means of multiplication.

In a preferred embodiment of the present invention said establishment of a compensation signal CS comprises the steps of establishing a forward path fed by a reference signal RS, establishing a negative feedback path from the output PWCS of said forward path, and scaling the signal of said feedback path proportionally with a representation PSVR of said power supply voltage PSV.

According to a preferred embodiment of the present invention, establishing a loop having a forward path and a feedback path, feeding said loop with a reference signal, preferably a square wave signal comprising a mean compensation value, e.g. 0.5, and scaling the feedback signal in proportion with the power supply voltage PSV or a representative thereof PSVR, establishes a compensation signal PWCS being substantially the inverse of the power supply voltage PSV, preferably multiplied by a factor determined by the reference signal RS.

The present invention further relates to a method for providing a reciprocated signal, comprising the steps of providing an electrical signal PSVR, providing at least one feedback loop comprising at least one forward path comprising at least one non-linearity MM and at least one feedback path comprising at least one variable amplifier BM, feeding to at least one of said at least one variable amplifier said electrical signal PSVR.

According to a preferred embodiment of the invention, an advantageous way of establishing the reciprocal of a value or signal is obtained. The present embodiment may thus substitute much more complex, demanding and inflexible divider means. The input signal PSVR may be any kind of signal that may be converted to an amplitude signal. The reciprocated signal is established as a pulse width modulated signal, but may easily be demodulated or otherwise converted afterwards.

In a preferred embodiment of the present invention at least one of said at least one forward path is fed with at least one reference signal RS.

According to a preferred embodiment of the invention, a reference signal may be used as input to the forward path in order to establish a factor that is multiplied to the reciprocal of the input signal. Furthermore, such a reference signal may be used to control the pulse width modulation. A preferred reference signal is in this connection e.g. a square wave signal with a duty cycle of 50%.

In a preferred embodiment of the present invention at least one of said at least one feedback loop comprises at least one quantization means QM.

In a preferred embodiment of the present invention at least one of said at least one feedback loop comprises at least one digital-to-analog conversion means DAC.

In a preferred embodiment of the present invention quantization noise introduced at least one of said at least one quantization means QM is shaped by at least one loop filter LF.

According to a preferred embodiment of the invention, noise, in particular quantization noise introduced by the quantization means, may be rejected and/or shaped, e.g. pushed to high frequencies, by means of one or more suitable loop filters.

In a preferred embodiment of the present invention said reference signal RS is an oscillating voltage signal.

A preferred oscillating voltage signal may be a square wave signal with a duty cycle of 50%, but any kind of preferably periodically oscillating signals may be used as reference signals.

In a preferred embodiment of the present invention said non-linearity MM is a limiter.

Preferably the non-linearity comprised by the forward path is a limiter. It is noted that the applicable limiter transfer functions may vary significantly within the scope of the invention, from hard-clipping limiters having only two output values, to the more soft-clipping limiters having several or even infinite output values. The soft-clipping limiters may advantageously be combined with multi-bit PWM quantizers as the transition between one clip and the opposite may be more detailed described.

According to the invention, a non-linearity is required for obtaining the desired combination of oscillation and modulation. Note that soft-clipping non-linearities are also regarded as limiters, even though their maximum or minimum output are basically only reached at infinite. Evidently, several other limiter characteristics may be applied within the scope of the invention In a preferred embodiment of the present invention said non-linearity MM is a comparator.

The present invention further relates to an electrical signal reciprocator CM establishing at least one reciprocated electrical signal PWCS, said electrical signal reciprocator comprising at least one feedback loop, said at least one feedback loop comprising at least one forward path being fed by a reference signal RS and comprising at least one non-linearity MM, and at least one feedback path comprising at least one variable amplifier BM, wherein at least one of said at least one variable amplifier is controlled on the basis of an electrical signal PSVR.

According to an embodiment of the invention an advantageous way of obtaining a reciprocate of an electrical signal is obtained. An example of such electrical signal may e.g. comprise a voltage, e.g. of a voltage power source, or any other suitably electrically represented signal.

According to a preferred embodiment of the invention, two separate signals may be fed to a feedback loop comprising at least one non-linearity in the forward path combined with a variable amplifier arranged in the feedback loop. One of the signals, e.g. the signal intended to be the divisor-representation of the intended operation may feed, and thereby control at least one variable amplifier in the feed-back loop, while the dividend may be established by a preferably stable signal source, preferably a square wave or other periodic signal generator.

In other words, an embodiment of the present invention may be used for establishing the result of (k/x), where the electrical signal controlling the variable amplifier corresponds to x, and the reference signal corresponds to k. Thus a variable divider is established.

In a preferred embodiment of the present invention at least one of said at least one feedback loop comprises at least one quantization means QM.

In a preferred embodiment of the present invention at least one of said at least one feedback loop comprises at least one digital-to-analog conversion means DAC.

In a preferred embodiment of the present invention at least one of said at least one feedback loop comprises at least one loop filter LF.

According to a preferred embodiment of the invention, noise, in particular quantization noise introduced by the quantization means, may be rejected and/or shaped, e.g. pushed to high frequencies, by means of one or more suitable loop filters.

In a preferred embodiment of the present invention at least one of said at least one forward path further comprises at least one analog-to-digital converter QM, preferably comprising at least one latch, and at least one of said at least one feedback path comprises at least one digital-to-analog converter DAC.

The analog-to-digital converter (A/D converter) is adapted for converting at least one output of said non-linearity into a digital signal. The at least one digital-to-analog converter (D/A converter) is adapted for converting the output of said A/D converter into at least one analog signal.

THE DRAWINGS

Figure 2A:
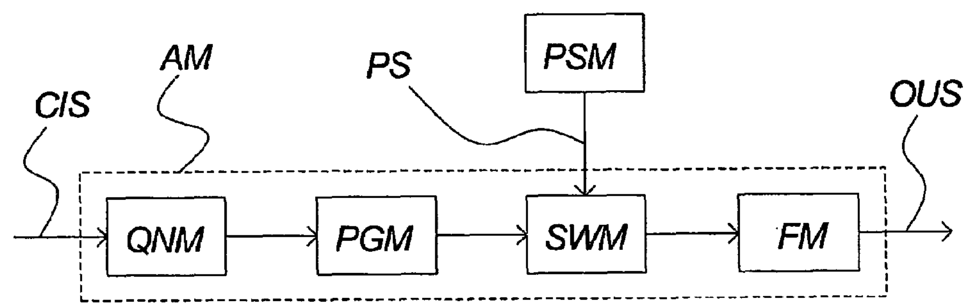
Figure 2B:
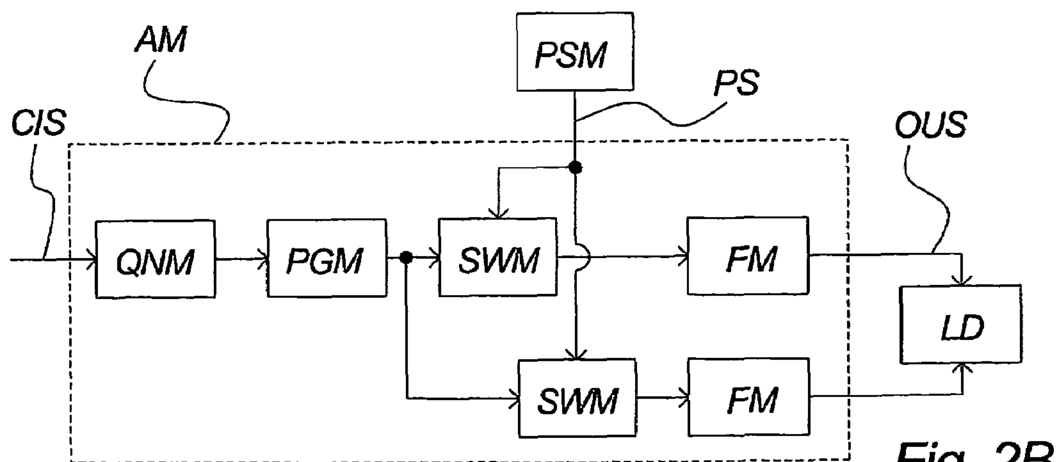
Figure 3A:
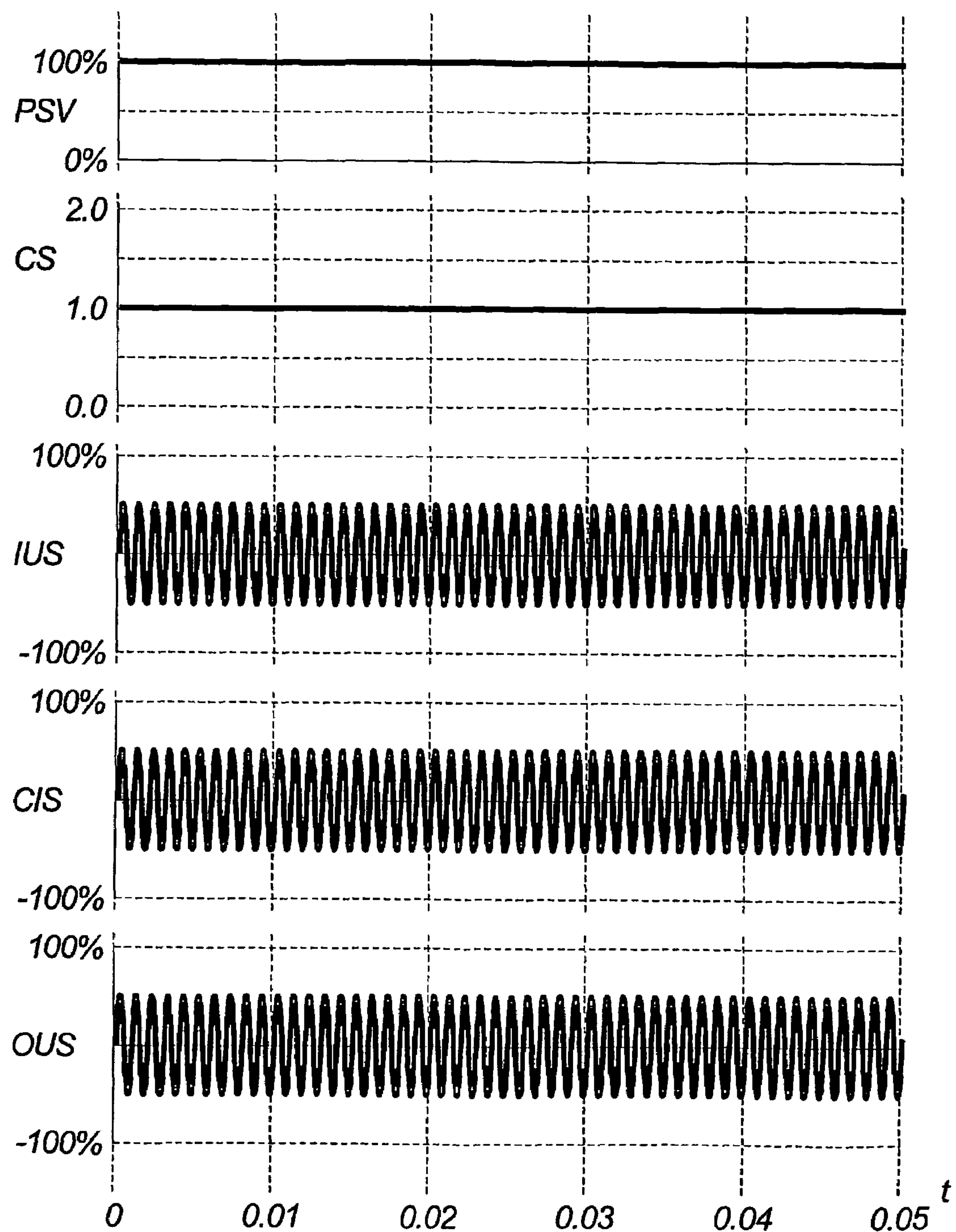
Figure 3B:
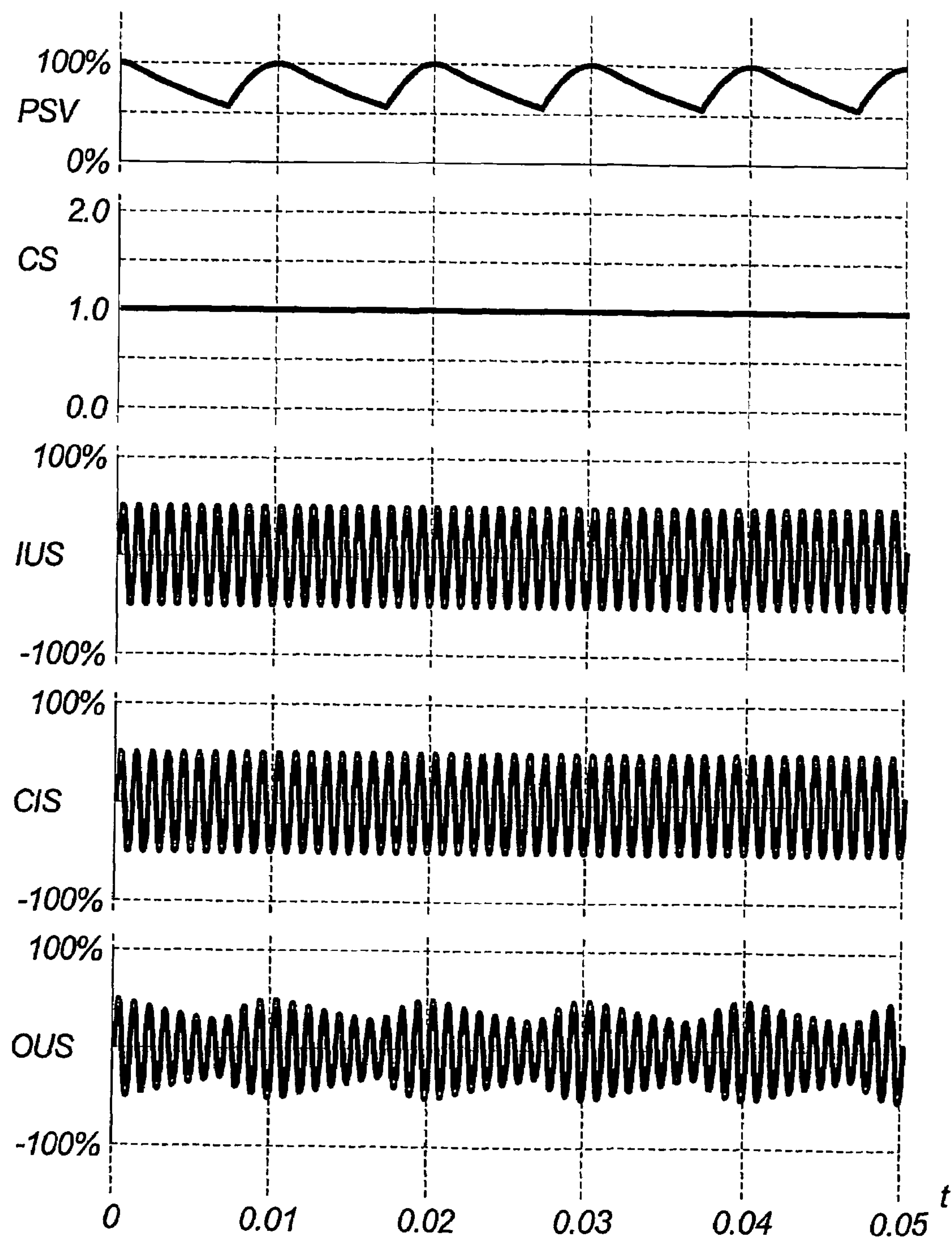
Figure 3C:
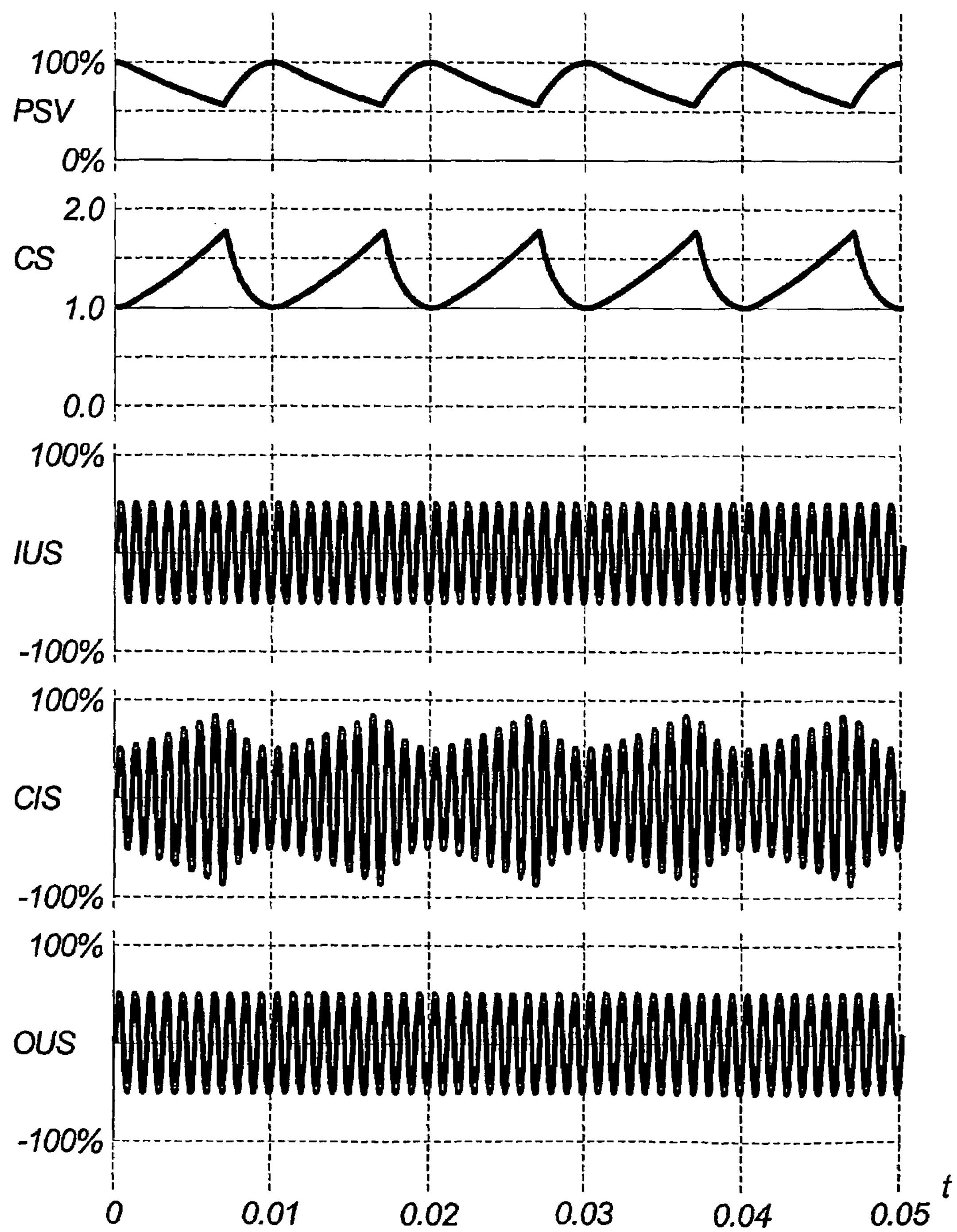
Figure 4:
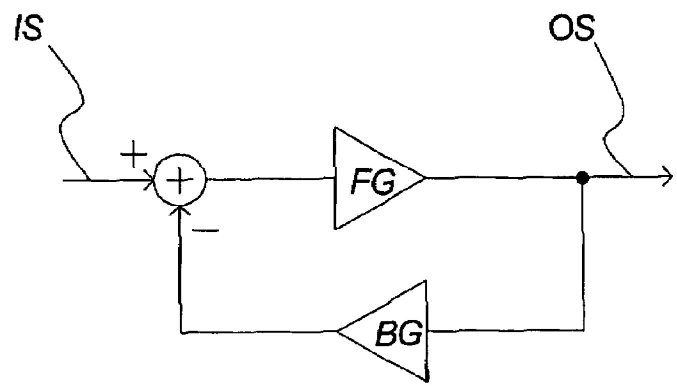
Figure 5:
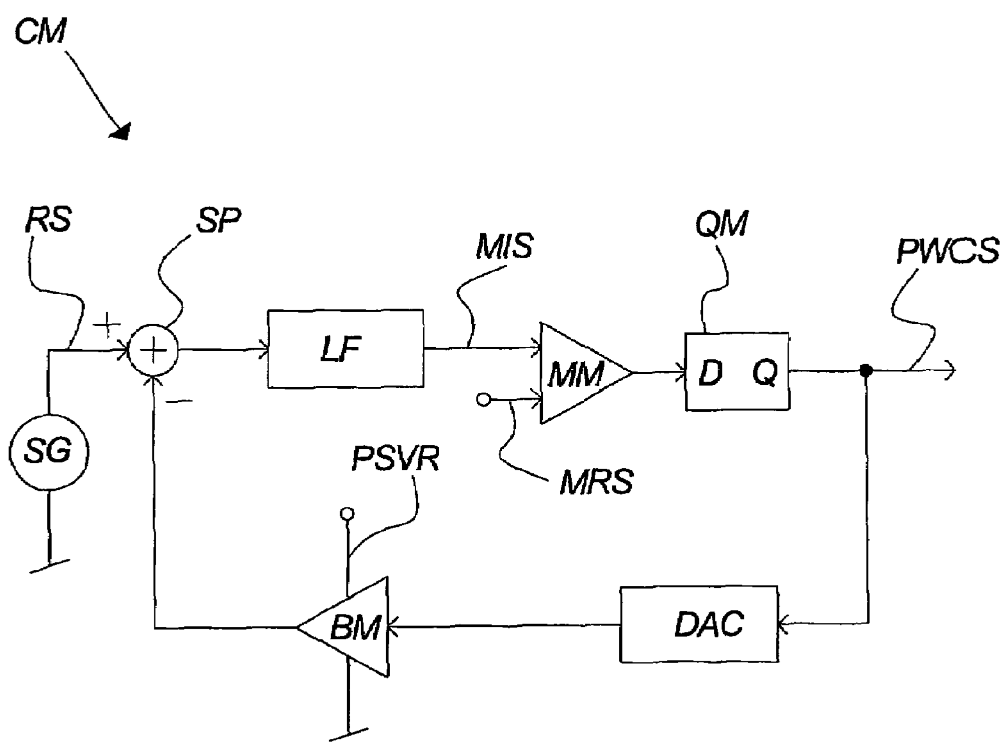
Figure 6:
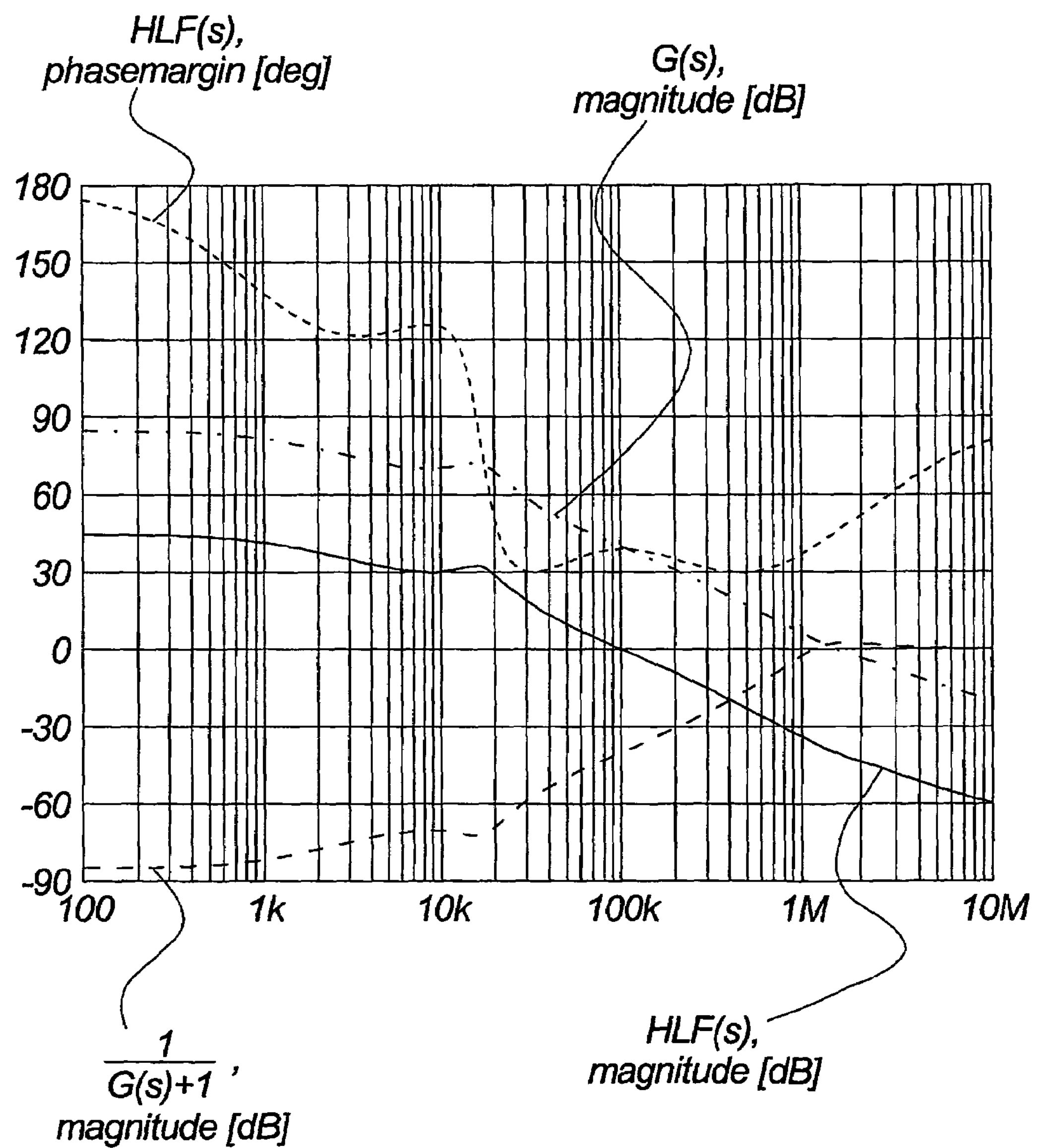
Figure 7:
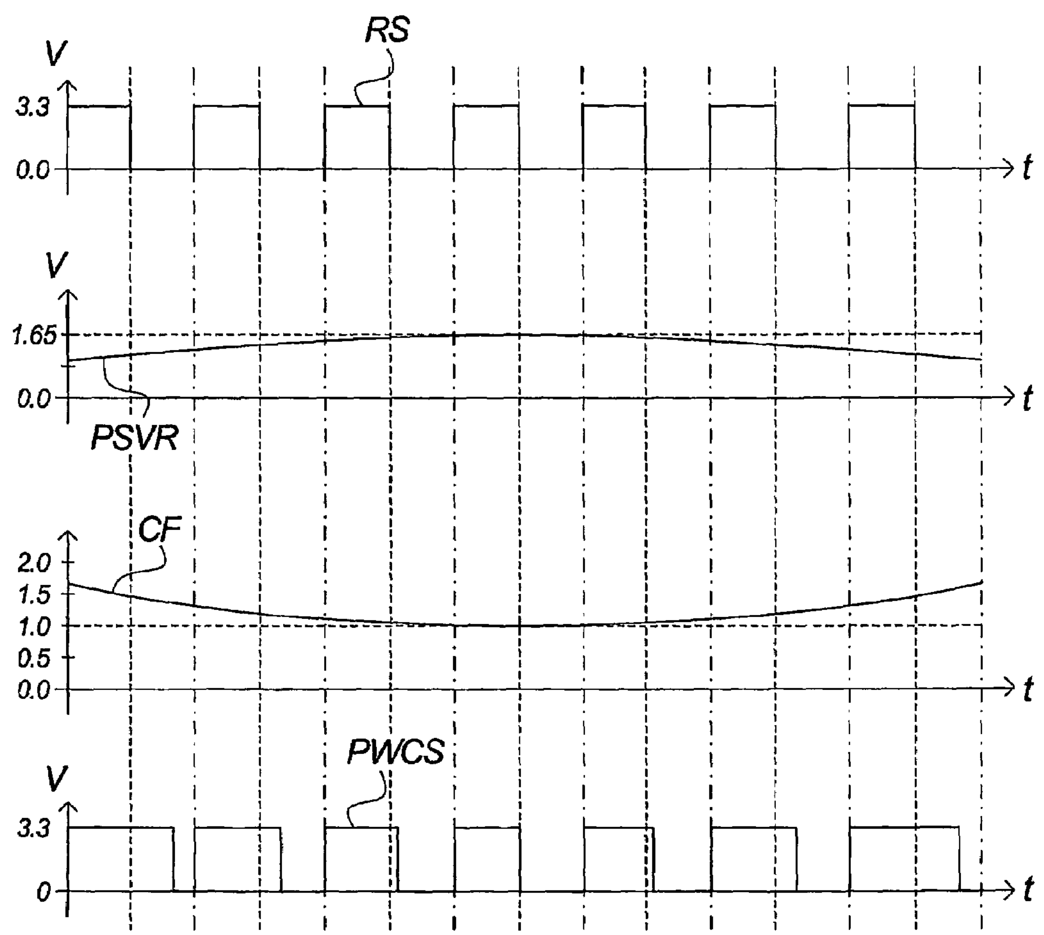
Figure 8:
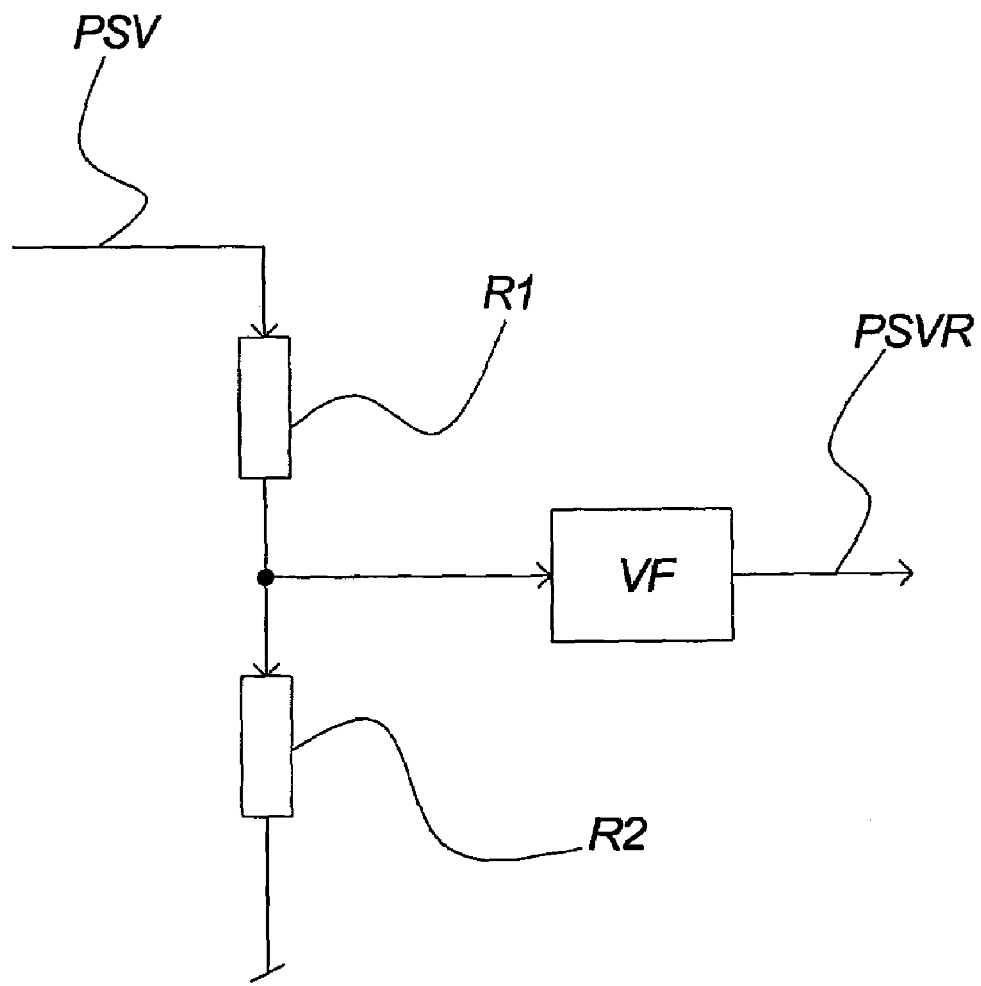

The invention will in the following be described with reference to the drawings where FIG. 1 comprises a conceptual diagram of an embodiment of the present invention, FIGS. 2A and 2B show examples of possible amplification means, FIG. 3A to 3C show examples of how the power supply error shapes the output signal with and without compensation, FIG. 4 serves to describe one of the techniques utilized by the present invention, FIG. 5 illustrates an embodiment of a compensation means according to the invention, FIG. 6 shows the frequency response of a possible loop filter, FIG. 7 shows examples of established compensation signals, and FIG. 8 shows an example of a real power supply level scaling circuit.

DETAILED DESCRIPTION

FIG. 1 comprises a conceptual diagram of an embodiment of the present invention. It comprises an input utility signal IUS which via a compensated input signal CIS is transformed into an output utility signal OUS by an amplification means AM. The amplification means AM is connected to a power supply means PSM via a power signal PS.

The amplification means AM does not denote any particular amplifier, filter or processing function, but merely represents any point in a signal path where the input signal CIS undergoes processing with a multiplicative relationship with the power supply voltage. When more of such points exist, the amplification means AM represents their overall effect on the input utility signal.

FIGS. 2A and 2B show examples of embodiments of such amplification means AM having a multiplicative relationship to the power supply voltage. Both examples comprise so-called PWM-amplifiers, also in some references referred to as class D amplifiers. FIG. 2A shows an embodiment of an amplification means AM comprising a quantization and noise shaping means QNM, a pulse generation means PGM, a switching means SWM and a filtering means FM. The power supply voltage is coupled to the switching means SWM via the power signal PS. The quantizing and noise shaping means QNM and the pulse generation means PGM serves to modulate the input signal CIS, which is preferably a digital pulse code modulated signal, into a pulse width modulated signal. The switching means SWM scales the PWM signal according to the power supply voltage. The filtering means serves to post-process the signal before any subsequent stages, e.g. demodulating it by means of low-pass filtering.

FIG. 2B comprises a differential PWM amplifier. It comprises the same elements as the embodiment of FIG. 2A, except that two PWM signals are now established by the pulse generation means PGM, and those two PWM signals are scaled by two switching means SWM, post-processed by two filtering means FM, and e.g. sent to each side of a load LD.

It is noted that the present invention may be used with any kind of PWM-amplifier embodiments, or any other kind of amplification or filtering means having a multiplicative relationship with a power supply voltage. For all such amplification means AM it applies that changes in the power supply voltage causes changes in the amplitude of the output signal OUS. As the utility data of a PWM signal is comprised by the combination of the preferably constant amplitude and the widths of the pulses, noise is injected to the signal when the amplitude is changed unintentionally.

The power supply means PSM may be any means that may be used for power supplying an amplification means AM according to the present invention. Such power supply means comprise transformers, batteries, DC, AC or other power sources, and may further comprise rectification means, e.g. diode bridges, stabilization means, e.g. capacitors, regulation means, e.g. voltage or current regulators, etc.

Conventionally the problem of changing or unstable power supply voltage is sought avoided by improving the power supplies, thus seeking to establish a power supply voltage that is as stable and constant as possible. This approach however, involves highly specialized or advanced power supplies, which are expensive, sensitive and inflexible, and which do not facilitate utilization of the full voltage range for amplification. As PWM amplifiers are often used in low cost applications utilizing their high efficiency compared to their cost, the need for such advanced, and more inefficient, power supplies easily undermines the advantages of PWM amplification.

Turning back to FIG. 1, an embodiment of a new approach that may not require improvements of the power supply or amplification means, is proposed. A compensation means CM is connected to the power signal PS, in order to monitor the power supply voltage PSV. The compensation means CM establishes on the basis of the power signal PS a pulse width modulated compensation signal PWCS. This signal represents, by means of a PWM encoding, substantially the reciprocal of the currently applied power supply voltage PSV multiplied by a factor K. The factor K represents a desired power supply voltage DV. When e.g. the currently applied power supply voltage PSV is 80% of the desired voltage DV (which may thus be represented by 100%), the PWM compensation signal PWCS may represent the value:

$$\frac{K}{PSV} = \frac{100\%}{80\%} = 1.25$$

This is the value by which the input utility signal IUS currently should be multiplied in order to compensate for the shortcoming power supply. However, some modulation and encoding differences, in particular different sample rates, prevent the PWM compensation signal PWCS from being used directly for multiplication with the input signal.

Hence, the preferably high-frequency pulse width modulated compensation signal PWCS is decimated, and in this connection low-pass filtered, by means of a decimation means DM. The output of the decimation means is a pulse code modulated compensation signal PCCS. This signal may represent values in the same format, i.e. encoding and rate, as the input utility signal, thus facilitating multiplication of the two signals. However, a further problem exists for most embodiments and applications, in that the time used for the filtering and decimation, and other processes e.g. performed on the input signal subsequent to the multiplication, e.g. PWM modulation, causes the value represented by the PCM compensation signal PCCS to be outdated relative to the current input utility signal IUS.

In order to overcome this, an extrapolation means EM may be inserted. On the basis of the PCM compensation signal PCCS and extrapolation, prediction or another useful method, it should establish an extrapolated compensation signal CS that probably more accurately corresponds to the input value currently represented by the input utility signal IUS.

Eventually the compensation signal CS is applied to the input utility signal IUS by means of a multiplication point MP, thus modifying the input utility signal IUS into a compensated input signal CIS. Thus the compensation signal CS is fed to the amplification means AM via the compensated input signal CIS.

FIG. 3A to 3C exemplifies the compensation principle of the present invention by showing how the different signals in the system develop under different circumstances. All signal diagrams have time in seconds along the x-axis and amplitude on the y-axis. It is noted that the shown signals, their development over time, their frequencies, amplitudes, etc. are only examples, and that the present invention is not restricted to any of the shown signals.

FIG. 3A shows an ideal situation, where the power supply voltage is stable, and no compensation is needed. The first signal shown in FIG. 3A is the power supply voltage PSV. It is as mentioned above stable at 100%. The second signal is the compensation signal CS. It is either absent or it has the value 1.0, which means that the input utility signal is not modified at the multiplication point MP. The third signal is the input utility signal IUS, which for this example carries a constant sinus tone. The fourth signal is the compensated input signal CIS. As mentioned above, this is exactly the same signal as the input utility signal IUS, as the compensation signal constantly has the value 1.0. The last signal is the output utility signal OUS which is the input utility signal IUS amplified by the value of the power supply voltage.

FIG. 3B shows a situation where no compensation is performed. The power supply voltage PSV comprises ripple and thus alternates between approximately 50% and 100%. As the compensation means is absent, the compensation signal has a value of 1.0, which causes no change to the input signal. The input utility signal IUS is the same sinus tone as in FIG. 3A, and because of the absent compensation, the compensated input signal CIS equals the input utility signal IUS. The power supply ripple thus causes the output utility signal OUS to be noisy, as it is scaled according to the noisy power supply voltage PSV.

FIG. 3C shows an example of a situation where a compensation signal CS is established by means of an embodiment of the compensation means of the present invention. The power supply voltage PSV is the same as in FIG. 3B, i.e. it comprises ripple. The compensation means of the present invention establishes, on the basis of the alternating power supply voltage, a compensation signal CS being the reciprocal of the power supply voltage, and multiplied by a factor to normalize it. Thus, the compensation signal alternates between values 1.0 and approximately 1.8. The input utility signal IUS is the same constant sinus tone as in FIGS. 3A and 3B but now the compensated input signal CIS has changed, as it represents the result of multiplying the input utility signal IUS with the compensation signal CS. When this compensated input signal CIS is scaled within the power supply dependent amplification means AM, the output signal OUS is established as a scaled, error-free version of the input utility signal IUS.

The compensation signal CS may be regarded the inverse of the power supply voltage or an inverted representation of the power supply voltage, in the sense that it substantially represents the reciprocal of the power supply voltage, or a scaled representation thereof, and not merely in the sense of mirroring the signal in the zero axis.

It is noted that the compensated input signal CIS should be able to hold sample values corresponding to the highest possible input utility signal value multiplied by the highest possible compensation signal value. Hence, if the resolutions of the input utility signal and the compensated input signal are the same, input data that utilizes the full resolution may be distorted due to clipping.

FIG. 4 is provided for describing one of the techniques behind the compensation means CM of the present invention. It comprises an input signal IS, a forward path with a forward gain FG, an output signal OS, and a feedback path from said output signal OS through a feedback gain BG to a summing point, where the feedback path signal is subtracted from the input signal.

The output signal content $V_{OS}$ thus recursively depends on the input signal $V_{IS}$ in the following way:

$$V_{OS}=FG(V_{IS}-BG\cdot V_{OS})$$

which may be rearranged into:

$$\Leftrightarrow V_{OS}(1+FG\cdot BG)=FG\cdot V_{IS}$$

$$\Leftrightarrow V_{OS}=\frac{FG}{1+FG\cdot BG}V_{IS}$$

If the product of FG·BG is much greater than 1, the expression may further be reduced into:

$$\Rightarrow V_{OS}=\Big|_{FG\cdot BG>>1}\frac{V_{IS}}{BG}$$

From the above expressions are seen that, within certain restrictions, a feedback loop may be used as a divider, where the input signal is divided by the feedback gain BG. This effect is advantageously used by the present invention in order to establish a representation of the reciprocal of a power supply voltage PSV, preferably multiplied by a factor K.

FIG. 5 illustrates a preferred embodiment of a compensation means CM according to an embodiment of the present invention. It comprises a loop, the forward path of which comprises a loop filter LF, a modulation means MM and a quantization means QM, and the feedback path of which comprises a digital-to-analog converter DAC and a buffering means BM. The feedback path is subtracted from the input to the forward path by means of a summing point SP. The loop is fed with a reference signal RS, preferably originating from a square wave generator SG. The output of the circuit corresponds to the above-mentioned PWM compensation signal PWCS, i.e. a pulse width modulated representation of the compensation value.

The quantization means QM is mainly provided in order for the PWM compensation signal PWCS to be in the digital domain, and the digital-to-analog converter DAC is thus required in order to establish an analog feedback signal. It is noted that principally the output PWCS may as well be analog, thus allowing the quantization means and converter to be omitted, but in most real applications the subsequent decimation, filtering and extrapolation processing is at least inexpedient to perform on an analog signal. An analog output of the power supply compensation circuit may be used when the input utility signal IUS is an analog signal e.g. for use as input to an analog PWM modulator. An advantageous alternative to establishing an analog PWM compensation signal PWCS would be to include a digital-to-analog converter subsequent to the extrapolation means EM, in order to convert the compensation signal CS into the analog domain.

The modulation means MM of FIG. 5 modulates the output of the loop filter LF into a PWM signal. The modulation means receives on one input a modulation input signal MIS, and on another input a modulation reference signal MRS. Preferably the modulation means comprises a comparator having the modulation reference signal input tied to a DC value, preferably 0 V. When the modulation input signal MIS comprises a high-frequency signal component, e.g. the reference signal RS, the comparator actually compares the input signal MIS with that high-frequency component. This causes the comparator to establish a PWM signal without need for a sawtooth reference signal as conventional PWM modulators. It is, however, noted that any kind of PWM modulator may be used for modulation means MM, including conventional modulators that require sawtooth or triangular reference inputs, or any other kind of means suitable for establishing a PWM signal. Also PWM modulators establishing any kind of PWM variants, e.g. NPWM, LPWM, etc., may be used for modulation means MM. When the preferred modulation means is used, i.e. a comparator with 0 V DC on the modulation reference signal MRS, the PWM switch frequency $f_{switch}$, i.e. the frequency of PWM periods, becomes the frequency of the high-frequency component, i.e. the frequency of the reference signal RS.

The reference signal RS serves the purpose of representing a reference level, e.g. corresponding to the desired power supply voltage DV, but preferably scaled to match the voltage levels of the compensation circuit. It furthermore preferably serves to provide a high-frequency component to the modulation means MM, thus controlling the PWM modulation. To serve these purposes, the reference signal RS is preferably established by means of a square wave generator SG generating a square wave with a duty cycle of 50%. Such a signal may in itself be considered a constant PWM signal. However, the reference signal RS may be any kind of signal, and may thus be adapted to match different power supplies, output signal requirements, PWM modulation techniques, loop filters, signal coding schemes, etc. As the frequency of the reference signal RS preferably controls the switch frequency $f_{switch}$, as described above, its frequency should at least partly be determined on the basis of knowledge of the frequency of the input utility signal IUS that the compensation circuit interacts with. In order to establish a suitable power supply compensation, the PWM switch frequency is preferably chosen to be in the order of 10-100 times, e.g. 32 times, the input utility signal IUS sample rate. When this for example is an audio signal with a sample rate of e.g. 48 kHz, the reference signal frequency, and thereby the switch frequency $f_{switch}$ preferably is in the order of 500 kHz-5 MHz, e.g. 1.536 MHz. The reference signal may preferably have a peak-to-peak voltage corresponding to the voltage used for the digital circuits, e.g. 3.3 V DC. In such case the above-mentioned factor K is preferably 3.3.

The quantization means QM is illustrated in FIG. 5 as a latch having an input D and an output Q. It is noted that any kind of sample means or analog-to-digital converter may be used instead, e.g. cascade-coupled latches, comparators, etc. The quantization means QM preferably takes a clock signal in addition to the input D, in order to control the sample rate, which preferably is in the order of 50-200 times, e.g. 128 times, the PWM switch frequency $f_{switch}$. The quantization means QM thus samples at a frequency of e.g. 196.6 MHz. The ratio between the switch frequency and the quantizing rate determines the resolution of the output PWM signal, as it preferably is a two-level signal. A ratio of e.g. 128 then allows the PWM edges of the PWM compensation signal PWCS to be established with a precision of 1/128 PWM period.

The loop filter LF as illustrated in the forward path in FIG. 5 represents the joint linear, time invariant filtering made anywhere in the loop. Thus, if a certain desired loop filter characteristic is practically most advantageously obtained by actually performing the filtering in the feedback path or subsequent to the modulation means MM, this is within the scope of the invention as well. The loop filter LF thus represents the equivalence model of all linear, time invariant filtering performed, in order to lighten the description and make the circuit easier to simulate.

The loop filter LF is preferably stable, but may as well facilitate self-oscillating PWM modulation by becoming unstable at certain frequencies. Examples of such self-oscillating modulators are WO 00/42702, WO 02/25357, WO 02/093973, U.S. Pat. No. 6,118,336, WO 98/19391, WO 00/27028, U.S. Pat. No. 6,249,182 and the patent application PCT/DK03/00447 hereby included by reference with respect to different basic principles regarding the establishment and controlling of the desired oscillation in combination with the desired modulation. It is noted that even though the modulation is self-oscillating, the switch frequency will be more or less locked due to the reference signal RS.

A preferred loop filter comprises simple zeroes at 10 kHz, 47 kHz and 1.8 MHz, simple poles at 1 kHz and 180 kHz, and a complex pole at 17 kHz with a Q of 2. The frequency response of such a loop filter HLF(s) is shown in FIG. 6. As seen, the phase margin never gets below 30 degrees, thus ensuring stability. It is noted that the present invention is not restricted to the mentioned preferred loop filter characteristic, and any kind of loop filter is within the scope of the present invention.

Because of the non-linear PWM modulation, the loop filter LF does not describe the total filtering applied. FIG. 6 thus further comprises a frequency response G(s) that better describes the actual response of the loop. When it comes to small signals, the modulation means MM may be described as a gain element. This is seen from FIG. 6, where G(s) is equal to HLF(s) except from a gain difference of approximately 40 dB in this example. As seen, G(s) intersects with the 0 dB level at the switch frequency $f_{switch}$ i.e. at approximately 1.5 MHz, which is a general property of PWM modulation loops, as seen from the references cited above.

A major objective of the loop filter is to reject quantization noise established by the relatively low-resolution quantization means QM. As the loop filter equivalence model is positioned first in the feedback path, noise injected subsequently to the feedback path, e.g. by the comparator and especially by the quantization means QM, is rejected by the loop filter characteristic proposed.

Seen from the noise injection point, i.e. the quantizing means QM, the actual loop characteristic G(s) causes a frequency response of:

$$\frac{1}{G(s)+1}$$

This response is also shown in FIG. 6, where it is seen that it rejects noise within a particular frequency band and let high-frequency noise through. This noise shaping is utilized at subsequent stages, i.e. within the decimation means DM, as the anti-aliasing performed there is able to cut away the high-frequency noise, but has to let low-frequency content through. Thereby an advantageous method of rejecting noise, in particular quantization errors, is obtained.

The buffering means BM scales the feedback signal according to a power supply voltage representation PSVR. It may be any kind of amplifier, filter, multiplication and/or divider means, etc. that is able to suit the purpose of modifying the feedback signal into a signal that represents the current power supply voltage PSV. It takes as input a power supply voltage representation PSVR, which preferably is a downscaled representation of the power supply voltage PSV provided by the power supply means PSM. Alternatively the buffering means BM may take any kind of signal that in some way represents the power signal, e.g. a pre-scaled signal, a modulated or converted signal, etc. The scaling of the power supply voltage should ensure that the ratio between the desired voltage DV and the power supply voltage PSV is mirrored by the ratio between the reference signal RS voltage and the power supply voltage representation PSVR.

As described with reference to FIG. 4, multiplications performed on the feedback signal are experienced from the output of the loop as divisions of the input signal. Thus, scaling the feedback signal according to the power supply voltage PSV or a representative thereof, causes the output signal PWCS to be divided by the power supply voltage PSV, or the representative thereof. Thus an advantageous method of obtaining the reciprocal of an erroneous signal, in order to be able to compensate for it, is obtained.

The above-illustrated power voltage inverting circuit may basically be designed according to the principles of the patent-application PCT/DK03/00613 “Self-oscillating A/D-converter”, hereby included by reference in the sense that a voltage power depending amplification is added in the feedback loop of the converter and that the A/D-converter is fed by a reference signal, preferably a square wave level generator, to which the feedback signal may be compared by subtraction. The resulting output of the inverting circuit will then be a digital inverse representation of the analog variation of the power supply.

Thus, according to an embodiment of the invention, the critical analog power supply voltage level may be compared to a stable reference, typically low voltage and therefore relatively well defined, and an inverse digital representation of the variation of the power supply may be directly output in a digital form suitable for pre-compensation prior to a non-linear modulation of the signal.

FIG. 7 illustrates how the PWM compensation signal PWCS, i.e. the output of the loop, may be established. The first timing diagram of FIG. 7 shows an example of a reference signal RS. It is a square wave signal with a duty cycle of 50% and a voltage of 3.3 V e.g. according to the power source supplying the digital circuits of the system. Vertical, dashed lines indicate its periods and half-periods in order to compare with the lower diagrams.

The second diagram shows an example of a possible power supply voltage representation PSVR, established by dividing the power supply voltage PSV with the factor by which the desired voltage DV is greater than the reference signal RS mean voltage i.e. 1.65 V. The next diagram shows the compensation factor CF that is the result of dividing the reference signal RS mean voltage of 1.65 V with the power supply voltage representation PSVR, and which may be established by the compensation means circuit shown in FIG. 5. In a preferred system the frequency of the reference signal RS indicated by the vertical dashed lines would be much faster compared to the changes of the power supply voltage PSV, but due to clarity a lower frequency is chosen, so in FIG. 7 a significant change of the power supply voltage takes place for each reference signal period.

The last diagram of FIG. 7 shows an example of the resulting PWM compensation signal PWCS. It comprises a pulse width modulation of the compensation factor CF. It is modulated so that a duty cycle of 50% indicates a compensation factor of 1.0, a duty cycle of 0% indicates a compensation factor of 0.0, and a duty cycle of 100% a compensation factor of 2.0. Thus, a compensation factor CF of e.g. 1.667, which is the first compensation factor value in the example, causes a PWM period with a duty cycle of 83.33% to be established, and a compensation factor CF of e.g. 1.3 causes a PWM period with a duty cycle of 65%. The duty cycle is calculated as the compensation factor CF multiplied by 50%. It is noted that the scope of the present invention is not in any way restricted to the example values of FIG. 7, and that any modulation scheme for the PWM compensation signal PWCS may be chosen. Any alternative modulation schemes, e.g. which are able to handle compensation factors greater than 2.0, or increases the resolution of a particular range, e.g. by only handling compensation factors in the range 1.2 to 1.5, are within the scope of the present invention, and may be preferred for a particular application.

The digital-to-analog converter DAC of FIG. 5 may be any suitable kind of means for converting a digital PWM signal into an analog PWM signal.

FIG. 8 shows an example of an embodiment of a means for establishing the power supply voltage representation PSVR on the basis of the power supply voltage PSV. Two resistors R1 and R2 establishes a conventional voltage divider, and a voltage follower VF ensures that the power supply means PSM is not loaded with any subsequent circuits to which the power supply voltage representation PSVR is fed. The resistors of the voltage divider may be any kind of resistors. Their mutual dimensions determine the factor by which the power supply voltage PSV is divided. When a power supply voltage representation PSVR of e.g. 1/15 of the power supply voltage PSV is desired, the second resistor R2 should have a resistance 14 times greater than the resistance of the first resistor R1, i.e.

$$PSVR = PSV \cdot \frac{R1}{R1 + R2}.$$

Example dimensions may in the case of PSVR being 1/15 of PSV be e.g. 1 kΩ for the first resistor R1, and 14 kΩ for the second resistor R2.

The voltage follower VF may be any kind of circuit that provides high, preferably infinite, input resistance, and still delivers the input voltage unchanged on the output. Thereby the divided power supply voltage may be conveyed to the power supply voltage representation PSVR without loading the power supply means PSM that provides the power supply voltage PSV. Preferably the voltage follower VF comprises an operational amplifier having the divided power supply voltage coupled to its positive input, and its output fed back unchanged to its negative input. The voltage follower should be power supplied by a voltage source greater than the divided power supply voltage, e.g. by a voltage corresponding to the power supply voltage PSV. It is noted that any other suitable buffering circuit may be used instead of the described, e.g. differential buffering, etc.

The factor by which the power supply voltage PSV is divided preferably corresponds to the factor by which the voltage DV desired for the switching amplifier is greater than the means voltage of the reference signal RS. When e.g. the reference signal RS is a square wave with a mean voltage of 1.65 V, i.e. a peak voltage of 3.3 V, and a voltage of 25 V is desired for the switching amplifier, the power supply voltage representation PSVR should be 3.3/25≈1/15 of the power supply voltage PSV.

It is noted that the present invention is not restricted to any particular scale correspondence between the different signals. Even when the ratio between the power supply voltage PSV and the power supply voltage representation PSVR is different than the ratio between the desired voltage DV and the reference signal RS, the present invention will still cause the power supply errors to be compensated, together with a scaling of the utility signal. Thus, by changing the ratio of PSV/PSVR or the reference signal RS, the desired voltage may be changed, and thus the virtual switch voltage. It is moreover noted that it is important that the power supply voltage representation PSVR except for a general scaling factor represents the power supply voltage PSV as accurately as possible, i.e. without any filtering, as otherwise incorrect compensation factors may be established.

The decimation means DM of FIG. 1 may be any kind of circuitry suitable for adapting the compensation factor comprised by the output signal PWCS of the compensation means CM into matching the input utility signal JUS. The adaptation may e.g. comprise demodulation, rate conversion or decimation, conversion of encoding, amplitude scaling, biasing, or any other signal adaptation processes.

As the compensation means CM output PWCS preferably is a two-level PWM signal sampled at a rate of e.g. 196.6 MHz, and the input utility signal IUS preferably is an audio signal having a resolution of e.g. 24 bits and a sample rate of e.g. 48 kHz, a preferred decimation means CM may comprise an anti-aliasing filter of the finite impulse response type (a FIR filter), combined with logics for decimating the number of output samples. The FIR filter, which preferably is a low-pass filter, serves at least three purposes. It rejects quantization noise originating from the quantization means QM within the compensation means CM, that have frequencies at which noise is not rejected by the compensation means loop filter. It also serves as anti-aliasing means, as anti-aliasing should always be performed before any sampling, and decimation may in this connection be considered a sampling process. And furthermore, it inherently provides for demodulation of the pulse width modulated compensation signal PWCS, as low-pass filtering has this effect on PWM signals. The FIR filter may preferably be established as three cascaded running average filters, preferably followed by two half-band FIR filters. Thus the decimation may be performed in three steps. The implementation of the first FIR filter comprising three cascaded running average filters causes decimation of the PWCS signal of e.g. 128 times from e.g. 196.6 MHz to e.g. 1.536 MHz, the first half-band FIR filter causes decimation of e.g. 2 times down to e.g. 768 kHz, and the second half-band FIR filter causes decimation of e.g. 2 times down to e.g. 384 kHz. This furthermore requires the input utility signal IUS to be upsampled e.g. 8 times from e.g. 48 kHz to the 384 kHz rate. This, however, preferably forms part of the PWM modulation anyhow performed on the input utility signal IUS.

The extrapolation means EM of FIG. 1 may be any kind of means for extrapolating the compensation factor, or predicting future compensation factors. As the compensation factor established and processed by the compensation means CM and decimation means DM actually corresponds to the compensation required some time ago due to delays in e.g. the compensation and decimation means, an extrapolation or prediction of the compensation factor is preferably performed prior to multiplying the input signal with the compensation factor.

What extrapolation or prediction method to provide by the extrapolation means EM in a particular implementation of the present invention depends on the delays of the compensation and decimation means of that particular implementation and on the nature of the changes of the power supply voltage, i.e. frequency, amount, etc. A preferred extrapolation means EM comprises modelling the compensation signal by a polynomial on the basis of a sequence of previous compensation factors, and extrapolating future compensation factors from that model. The polynomial is preferably a second or third order polynomial, established on the basis of the previous 3 or 4 compensation factor samples. The delay to be compensated for by the extrapolation means may typically correspond to 2 to 10 samples of the input utility signal, e.g. 6 samples of a signal with a rate of 384 kHz. When the delay corresponds to e.g. 6 samples, and the extrapolation means e.g. models the compensation signal by a second order polynomial $y(n)$ on the basis of the compensation factors $x(n-2)$, $x(n-1)$ and $x(n)$, it should output $y(n+6)$ as the next compensation signal sample.

Simulations show that using second or third order polynomials for compensating delays corresponding to e.g. 6, 8 and 10 samples of the input utility signal, when the frequency of the power supply voltage changes, e.g. ripple, is less than 10 kHz, increases the effect of providing compensation means CM for compensating for an unstable power supply.

It is noted that in order to establish a beneficial extrapolation algorithm, certain knowledge about the behavior of the error-inducing signal, i.e. the variations in the power supply voltage, may be required.

The invention claimed is:

1. Method for providing a reciprocated signal, comprising providing an electrical signal (PSVR), providing at least one feedback loop comprising at least one forward path comprising at least one non-linearity (MM) and at least one feedback path comprising at least one variable amplifier (BM), and feeding to at least one of said at least one variable amplifier said electrical signal (PSVR).

2. Method for providing a reciprocated signal according to claim 1, whereby at least one of said at least one forward path is fed with at least one reference signal (RS).

3. Method for providing a reciprocated signal according to claim 1, whereby at least one of said at least one feedback loop comprises at least one quantization means (QM).

4. Method for providing a reciprocated signal according to claim 1, whereby at least one of said at least one feedback loop comprises at least one digital-to-analog conversion means (DAC).

5. Method for providing a reciprocated signal according to claim 1, whereby quantization noise introduced by at least one of said at least one quantization means (QM) is shaped by at least one loop filter (LF).

6. Method for providing a reciprocated signal according to claim 2, whereby said reference signal (RS) is an oscillating voltage signal.

7. Method for providing a reciprocated signal according to claim 1, whereby said non-linearity (MM) is a limiter.

8. Method for providing a reciprocated signal according to claim 1, whereby said non-linearity (MM) is a comparator.

9. Electrical signal reciprocator (CM) establishing at least one reciprocated electrical signal (PWCS), said electrical signal reciprocator comprising at least one feedback loop, said at least one feedback loop comprising at least one forward path being fed by a reference signal (RS) and comprising at least one non-linearity (MM), and at least one feedback path comprising at least one variable amplifier (BM), wherein at least one of said at least one variable amplifier is controlled on the basis of an electrical signal (PSVR), and wherein at least one of said at least one feedback loop is self-oscillating.

10. Electrical signal reciprocator (CM) according to claim 9, wherein at least one of said at least one feedback loop comprises at least one quantization means (QM).

11. Electrical signal reciprocator (CM) according to claim 9, wherein at least one of said at least one feedback loop comprises at least one digital-to-analog conversion means (DAC).

12. Electrical signal reciprocator (CM) according to claim 9, wherein at least one of said at least one feedback loop comprises at least one loop filter (LF).

13. Electrical signal reciprocator (CM) according to claim 9, wherein at least one of said at least one forward path further comprises at least one analog-to-digital converter (QM), preferably comprising at least one latch, and at least one of said at least one feedback path comprises at least one digital-to-analog converter (DAC).

14. Electrical signal reciprocator according to claim 9, wherein said at least one self-oscillating feedback loop comprises a loop filter that is unstable for at least one frequency band.

* * * * *

UNITED STATES PATENT AND TRADEMARK OFFICE

CERTIFICATE OF CORRECTION

PATENT NO. : 7,551,022 B2
APPLICATION NO. : 10/575738
DATED : June 23, 2009
INVENTOR(S) : Lars Arknaes-Pedersen et al.

It is certified that error appears in the above-identified patent and that said Letters Patent is hereby corrected as shown below:

Title Page, Item (73), Assignee, delete "TC Electronic A/S (DK)" and insert therefor --The TC Group A/S, (DK)--.

Signed and Sealed this

Sixteenth Day of March, 2010

David J. Kappos
*Director of the United States Patent and Trademark Office*